United States Patent [19]
Wert et al.

[11] Patent Number: 5,555,149
[45] Date of Patent: Sep. 10, 1996

[54] OVERVOLTAGE PROTECTION

[75] Inventors: Joseph D. Wert, Arlington; Richard L. Duncan, Bedford, both of Tex.

[73] Assignee: National Semiconductor Corporation, Santa Clara, Calif.

[21] Appl. No.: 430,579

[22] Filed: Apr. 28, 1995

Related U.S. Application Data

[63] Continuation of Ser. No. 73,376, Jun. 7, 1993, abandoned.

[51] Int. Cl.$^6$ ........................................ H02H 7/00
[52] U.S. Cl. ........................................ 361/18; 361/56
[58] Field of Search ........................ 361/18, 56, 91; 307/448, 451, 475; 365/226; 257/355, 357

[56] References Cited

U.S. PATENT DOCUMENTS

| | | | |
|---|---|---|---|
| 3,949,242 | 4/1976 | Hirasawa et al. | 307/205 |
| 4,583,203 | 4/1986 | Monk | 365/189 |
| 4,583,204 | 4/1986 | Takemae et al. | 365/226 |
| 4,670,668 | 6/1987 | Liu . | |
| 4,670,861 | 6/1987 | Shu et al. . | |
| 4,782,250 | 11/1988 | Adams et al. | 307/473 |
| 4,825,275 | 4/1989 | Tomassetti | 357/43 |
| 4,862,240 | 8/1989 | Watanabe et al. | 357/42 |
| 4,864,373 | 9/1989 | Miyashita . | |
| 4,906,056 | 3/1990 | Taniguchi . | |
| 4,930,112 | 5/1990 | Tanaka et al. | 365/226 |
| 4,937,700 | 6/1990 | Iwahashi | 361/91 |
| 4,952,825 | 8/1990 | Yoshida | 307/475 |
| 4,961,010 | 10/1990 | Davis . | |
| 5,004,936 | 4/1991 | Andresen | 307/443 |
| 5,027,008 | 6/1991 | Runaldue . | |
| 5,036,222 | 7/1991 | Davis . | |
| 5,060,044 | 10/1991 | Tomassetti . | |
| 5,087,579 | 2/1992 | Tomassetti | 437/31 |
| 5,117,129 | 5/1992 | Hoffman et al. . | |
| 5,134,316 | 7/1992 | Ta | 307/475 |
| 5,160,855 | 11/1992 | Dobberpuhl | 307/270 |
| 5,191,244 | 3/1993 | Runaldue et al. | 307/475 |
| 5,300,832 | 4/1994 | Rogers | 307/475 |

FOREIGN PATENT DOCUMENTS

| | | |
|---|---|---|
| 305676 | 3/1989 | European Pat. Off. . |
| 05602 | 3/1989 | WIPO . |
| PCT/US91/ 98341 | 11/1991 | WIPO . |

OTHER PUBLICATIONS

Paper entitled: "A Tidal Wave of 3-V ICs Opens Up Many Options" by Dave Bursky, published in Electronic Design, Aug. 20, 1992, pp. 37-47.
Article entitled: "Level Transistor Logic with no DC Power Dissipation" published in the International Technology Disclosure Journal 9:06 by author unknown 104279.

*Primary Examiner*—Jeffrey A. Gaffin
*Assistant Examiner*—Sally C. Medley
*Attorney, Agent, or Firm*—Skjerven, Morrill, MacPherson, Franklin & Friel

[57] ABSTRACT

The present invention provides input and output buffers which block the charge leakage from the bus to the internal power supply when the bus voltage exceeds the internal power supply voltage or when the buffer is powered down. An isolation transistor is connected in series with a pull-up transistor between the internal power supply and the output terminal which is connected to the bus. A circuit that controls the pull-up transistor in response to an enable signal and a data input signal, controls also the isolation transistor so that when the driver is enabled and the pull-up transistor is on, the isolation transistor is also on allowing the pull-up transistor to drive the output terminal. A transistor between the circuit and the isolation transistor gate isolates the gate from the circuit when the driver is disabled. Thus, when the driver is disabled, the circuit does not control the isolation transistor. Instead, the isolation transistor is controlled by a pass-through transistor connected between the gate of the isolation transistor and the output terminal. When the driver is enabled, the pass-through transistor is off. When the driver is disabled and the output terminal voltage exceeds the predetermined value, the pass-through transistor turns on to turn off the isolation transistor. The isolation transistor is a PMOS transistor in some embodiments. The isolation transistor drain and backgate are connected to turn off the drain/backgate diode.

13 Claims, 4 Drawing Sheets

OVERVOLTAGE PROTECTION

This application is a continuation of application Ser. No. 08/073,376, filed Jun. 7, 1993 now abandoned.

BACKGROUND OF THE INVENTION

1. Field of the Invention

The present invention relates to overvoltage protection, and more particularly to preventing charge leakage in output and input/output buffers when the voltage on the buffer output exceeds in magnitude the buffer internal power supply voltage or when the buffer is powered down.

2. Description of Related Art

Electronic systems sometimes combine modules powered by different supply voltages. For example, in battery powered laptop, notebook and hand-held computers, some modules are powered by a 3.0 V or 3.3 V voltage while other modules are powered by a 5.0 V voltage. The use of the lower power supply voltage such as 3.3 V reduces power consumption and thus allows extending the system operation time before the battery must be recharged or replaced. However, modules such as disk drives are powered by 5.0 V because they perform better when powered by the higher voltage.

If a 3.3 V module and a 5.0 V module are connected to a common bus and the 5.0 V module drives the bus with a 5.0 V signal, a charge leakage path may form between the bus and the 3.3 V power supply. For example, suppose that the output driver of an input/output buffer of the 3.3 V module includes a PMOS pull-up transistor connected between the 3.3 V voltage and the bus. When the bus is driven by the 5.0 V module, the 3.3 V module drives the PMOS transistor gate with 3.3 V to turn the transistor off to tri-state the bus. When the bus voltage rises to 5.0 V, the PMOS transistor turns on providing a conductive channel between the bus and the 3.3 V power supply. Moreover, because the PMOS transistor backgate is typically held at 3.3 V, the drain/backgate diode turns on providing another conductive path between the bus and the 3.3 V power supply. The undesirable results include loading the bus and causing "bus contention", degrading the bus signals, and causing possible false signals on the bus.

Similar problems occur when a selected module is powered down while other modules are powered up, whether or not different power supply voltages are used in the system. When the module is powered down in order, for example, to save power or to replace the module, a leakage path can form between the bus and the module internal power supply.

Thus, it is desirable to provide output drivers which do not provide a leakage path between the bus and the module internal power supply.

SUMMARY OF THE INVENTION

The present invention provides, in some embodiments, output buffers and input/output buffers which block the charge leakage from the bus to the internal power supply when the bus voltage exceeds in magnitude the internal power supply voltage or when the module is powered down. This functionality is achieved as follows in some embodiments. An isolation transistor is connected in series with a pull-up transistor between the internal power supply and the output terminal which is connected to the bus. A circuit that controls the pull-up transistor in response to an enable signal and a data input signal, controls also the isolation transistor so that when the driver is enabled and the pull-up transistor is on, the isolation transistor is also on allowing the pull-up transistor to drive the output terminal. Another transistor is provided between the circuit and the gate of the isolation transistor to isolate the gate from the circuit when the driver is disabled. Thus, when the driver is disabled, the circuit does not control the isolation transistor. Instead, the isolation transistor is controlled by a pass-through transistor connected between the gate of the isolation transistor and the output terminal. When the driver is enabled, the pass-through transistor is off. When the driver is disabled and the voltage on the output terminal exceeds in magnitude the voltage provided by the internal power supply by at least a predetermined value, the pass-through transistor turns on to turn off the isolation transistor.

The isolation transistor is a PMOS transistor in some embodiments. The drain of the isolation transistor is connected to the backgate to turn off the drain/backgate diode.

Other features of the invention are described below. The invention is defined by the appended claims.

DESCRIPTION OF THE PREFERRED EMBODIMENTS

Figure 1:
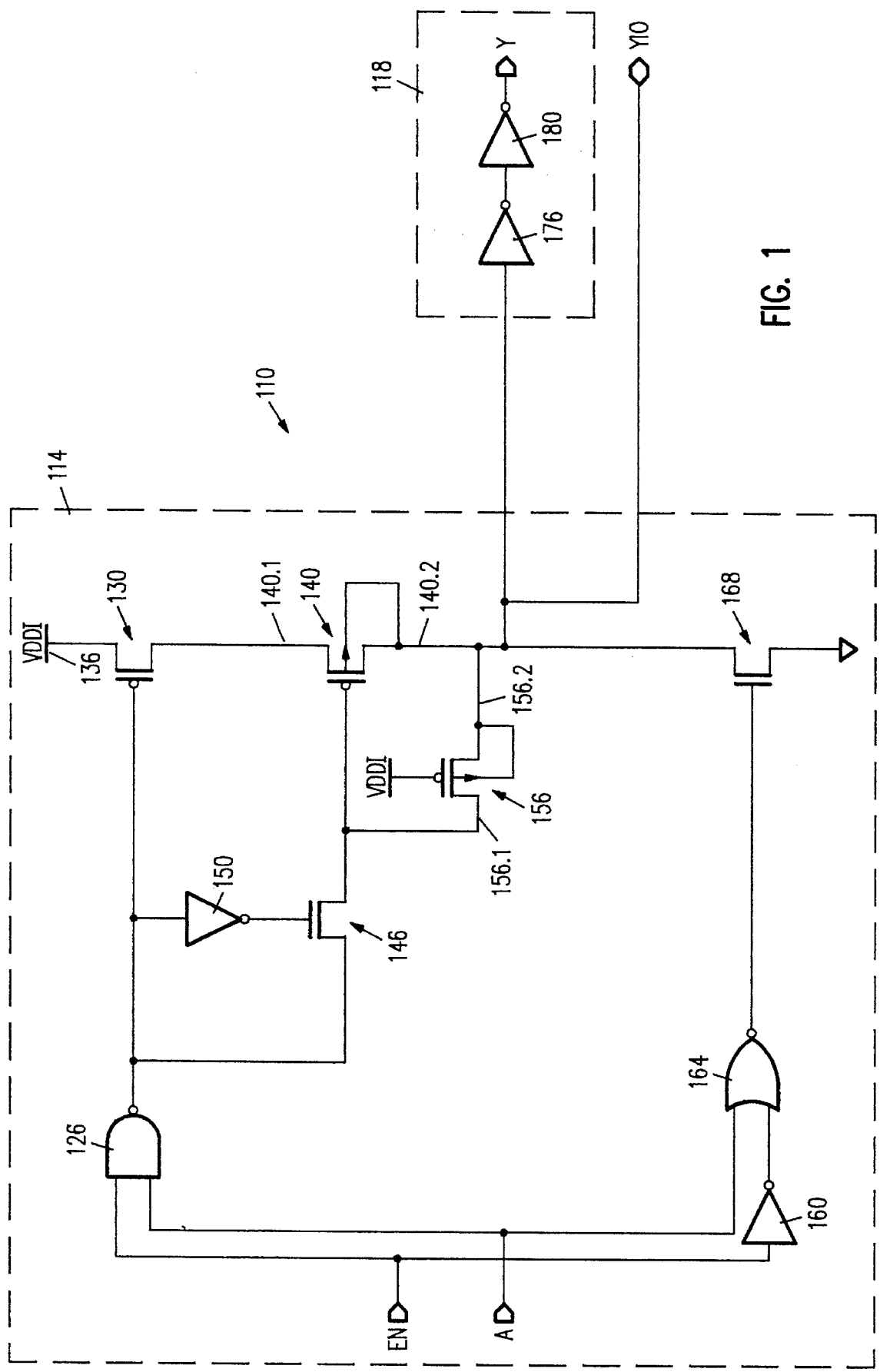
FIGS. 1–4 are circuit diagrams of input/output buffers according to the present invention.

FIG. 1 is a circuit diagram of input/output buffer 110 which includes output driver 114 and input buffer 118. When driver 114 is enabled by a high signal on the enable terminal EN, driver 114 drives input/output terminal YIO with an output signal logically equivalent to the signal on data input terminal A. When the signal on terminal EN is low, driver 114 tri-states terminal YIO. Buffer 118 amplifies input signals on terminal YIO to provide the amplified signals on terminal Y.

Terminal YIO is connected to a bus (not shown) connected to one or more other modules (not shown). One or more of these modules can drive the bus with a voltage higher than the buffer 110 internal power supply voltage VDDI. In one example, buffer 110 is powered by 3.3 V, and one or more other modules can drive the bus with 5.0 V. As explained below, driver 114 includes overvoltage protection circuitry to prevent charge leakage from the bus to the buffer 110 power supply when the bus is at 5.0 V.

Driver 114 includes NAND gate 126 having one input connected to enable terminal EN and another input connected to data input terminal A. In some embodiments, all the logic gates including gate 126 and all the inverters are implemented in CMOS technology. The logic gates and the inverters are powered by the internal supply voltage VDDI (VDD Internal).

The output of gate 126 is connected to the gate of PMOS pull-up transistor 130.

The source of transistor 130 is connected to power supply terminal 136 which receives power supply voltage VDDI. VDDI is 3.3 V in some embodiments. The drain of transistor 130 is connected to the source 140.1 of PMOS transistor 140 whose drain 140.2 is connected to terminal YIO. Thus, transistors 130 and 140 are connected in series between terminals 136 and YIO.

The backgate of transistor 140 is connected to drain 140.2.

The output of NAND gate 126 is connected to one source/drain terminal of NMOS transistor 146 whose other source/drain terminal is connected to the gate of transistor 140. The output of NAND gate 126 is connected in addition to the input of inverter 150 whose output is connected to the gate of transistor 146.

The gate of transistor 140 is connected to source/drain terminal 156.1 of PMOS transistor 156. The other source/drain terminal 156.2 of transistor 156 is connected to terminal YIO. The transistor gate is connected to power supply voltage VDDI. The backgate of transistor 156 is connected to terminal 156.2.

Enable terminal EN is connected to the input of inverter 160 whose output is connected to one input of NOR gate 164. The other input of gate 164 is connected to data input terminal A. The output of gate 164 is connected to the gate of pull-down NMOS transistor 168 whose drain is connected to input/output terminal YIO and whose source is connected to ground.

Input buffer 118 is formed by inverters 176, 180 connected in series between terminals YIO and Y.

The backgates of all the PMOS transistors of buffer 110 except transistors 140 and 156 are connected to power supply voltage VDDI. The backgates of all the NMOS transistors in buffer 110 are connected to ground.

In some embodiments, the threshold voltage VTN of the NMOS transistors is about 0.7 V, and the threshold voltage VTP of the PMOS transistors is about −0.9 V.

When the enable terminal EN is high, driver 114 is enabled. Gates 126, 164 each invert the signal on data input terminal A. When terminal A is high, the output of gate 126 is low turning on transistor 130. Transistor 146 is on delivering a low voltage to the gate of transistor 140 and thus turning transistor 140 on. Transistor 156 is off. Pull-down transistor 168 is also off, and input/output terminal YIO is driven with a 3.3 V signal by transistors 130, 140.

When terminal A is low, the output of gate 126 is high turning off transistor 130. Inverter 150 supplies a 0 V signal to the gate of transistor 146 turning the transistor off. Transistor 146 isolates the output of NAND gate 126 from source/drain terminal 156.1 of transistor 156 thereby preventing the charge leakage from the output of NAND gate 126 to terminal YIO through the diode formed by source/drain terminal 156.1 and the backgate of transistor 156.

Pull-down transistor 168 pulls terminal YIO to 0 V.

When enable terminal EN is low, transistors 130, 168 are off, and driver 114 is disabled. If the bus is driven with a 5.0 V signal, transistors 140, 156 block the charge leakage from the bus to voltage supply VDDI. More particularly, when the voltage on terminal YIO exceeds the voltage VDDI by at least the PMOS threshold voltage so as to possibly turn on transistor 130, transistor 156 turns on raising the voltage on the gate of transistor 140 to the voltage on terminal YIO. Hence the field effect conduction of transistor 140 is suppressed. The conduction through the diode formed by source/drain terminal 140.2 and the backgate of transistor 140 is also suppressed because the backgate is connected to terminal 140.2 so that the diode is not forward biased. Transistor 146 is off protecting NAND gate 126 from the high voltage on the gate of transistor 140.

Because the backgate of transistor 156 is connected to source/drain terminal 156.2 rather than to voltage VDDI, the diode formed by terminal 156.2 and the backgate is off so that no leakage occurs through the diode from terminal YIO to voltage supply VDDI.

Figure 2:
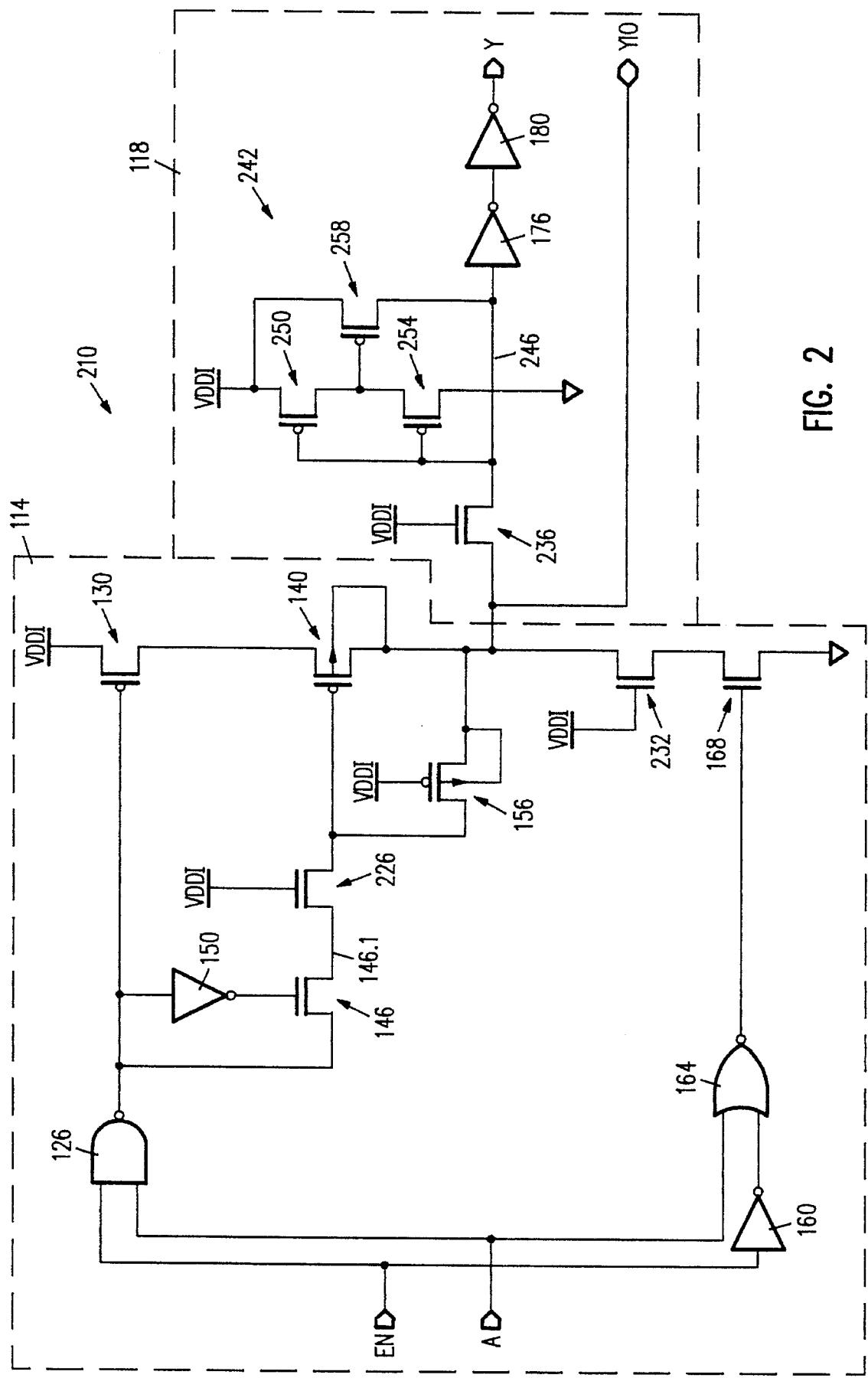

FIG. 2 shows input/output buffer 210 suitable for circuits in which it is forbidden for the gate-to-source and gate-to-drain voltages to reach the value 5.0 V. The 5.0 V gate-to-source and gate-to-drain voltages are forbidden in some buffers designed for 3.3 V operation because the 5.0 V voltages can compromise the thin gate oxide in such buffers. In some embodiments, the maximum gate-to-source and gate-to-drain voltage allowed is about 4.2 V. Input/output buffer 210 is similar to buffer 110. To prevent the forbidden voltages, buffer 210 includes NMOS transistor 226 connected between source/drain 146.1 of transistor 146 and the gate of transistor 140. The gate of transistor 226 is connected to power supply voltage VDDI. Transistor 226 prevents the voltage drop between the gate of transistor 146 and source/drain 146.1 from reaching the value of 5.0 V when enable terminal EN is low and the voltage on the gate of transistor 140 is 5.0 V.

Similarly, NMOS transistor 232 connected between terminal YIO and the drain of transistor 168 prevents the gate-to-drain voltage of transistor 168 from reaching 5.0 V when terminal EN is low (and hence the gate of transistor 168 is at 0 V) and the voltage on terminal YIO is 5.0 V.

The gates of transistors 232, 226 are at voltage VDDI, and hence the gate-to-source and gate-to-drain voltages of transistors 232, 226 are below 5.0 V.

NMOS transistor 236 whose gate is connected to voltage VDDI prevents the gate-to-source and gate-to-drain voltages in the transistors of inverter 176 from reaching 5.0 V. Transistor 236 is connected between terminal YIO and the input of inverter 176.

Because the gate of transistor 236 is connected to voltage VDDI, transistor 236 passes at most the voltage VDDI-VTN from terminal YIO to the input of inverter 176. When the voltage on terminal YIO is 3.3 V or higher, bootstrap circuit 242 pulls node 246 at the input of inverter 176 to the voltage VDDI to reduce power consumption in the CMOS inverter 176. Bootstrap circuit 242 includes PMOS transistor 250 whose source is connected to voltage VDDI and whose drain is connected to the drain of NMOS transistor 254. The source of transistor 254 is connected to ground. The gates of transistors 250, 254 are connected to node 246. The drains are connected to the gate of PMOS transistor 258 whose source is connected to power supply voltage VDDI and whose drain is connected to node 246.

The threshold voltage of the inverter formed by transistors 250, 254 is below VDDI-VTN. For example, in some embodiments, VDDI=3.3 V, VTN=0.7 V, and the inverter threshold voltage is about 60% of VDDI, that is, about 1.98 V. Hence when transistor 236 charges node VTN to VDDI-VTN, the inverter drives the gate of transistor 258 to 0 V. Transistor 258 then pulls up node 246 to VDDI. Consequently, transistor 250 turns off reducing power consumption. Transistor 236 turns off isolating node 246 from terminal YIO.

When the voltage on node 246 is 0 V, transistor 258 is off isolating node 246 from power supply voltage VDDI.

Figure 3:
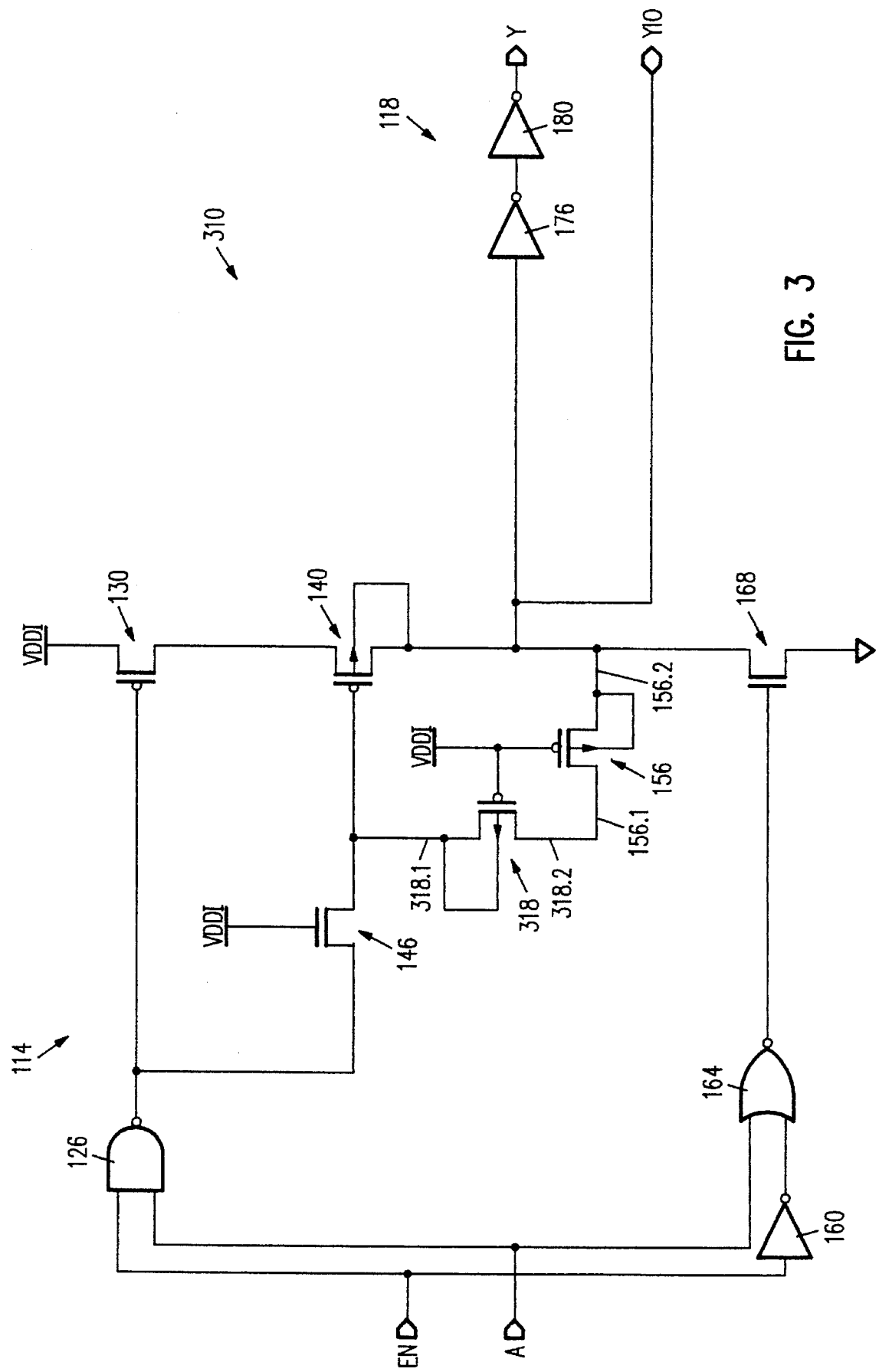

Input/output buffer 310 of FIG. 3 is similar to input/output buffer 110 of FIG. 1, but the gate of transistor 146 of buffer 310 is connected to power supply voltage VDDI. Inverter 150 of FIG. 1 is eliminated simplifying the circuit. To prevent charge leakage from the gate of transistor 140 to input/output terminal YIO, PMOS transistor 318 is connected in series with transistor 156. More particularly, source/drain terminal 318.1 of transistor 318 is connected to the gate of transistor 140. Source/drain terminal 318.2 of transistor 318 is connected to source/drain terminal 156.1 of transistor 156. Source/drain terminal 156.2 of transistor 156 is connected to input/output terminal YIO. Source/drain terminal 318.1 is connected to the backgate of transistor 318. Source/drain terminal 156.2 is connected to the backgate of transistor 156. The gates of transistors 318, 156 are connected to supply voltage VDDI.

Due to the backgate connection of transistors 156, 318, the diode formed by the backgate of transistor 318 and source/drain terminal 318.2 and the diode formed by the backgate of transistor 156 and source/drain terminal 156.1 are connected back-to-back to suppress the diode conduction. Thus, when enable terminal EN is high, the gate of transistor 140 is isolated from input/output terminal YIO since both the diode conduction and the field effect conduction are through transistors 318, 156 are suppressed.

When enable terminal EN is low and the voltage on terminal YIO exceeds the supply voltage VDDI by at least the absolute value |VTP| of the PMOS threshold voltage, transistors 156, 318 turn on providing field effect conduction between the gate of transistor 140 and the input/output terminal YIO.

Figure 4:
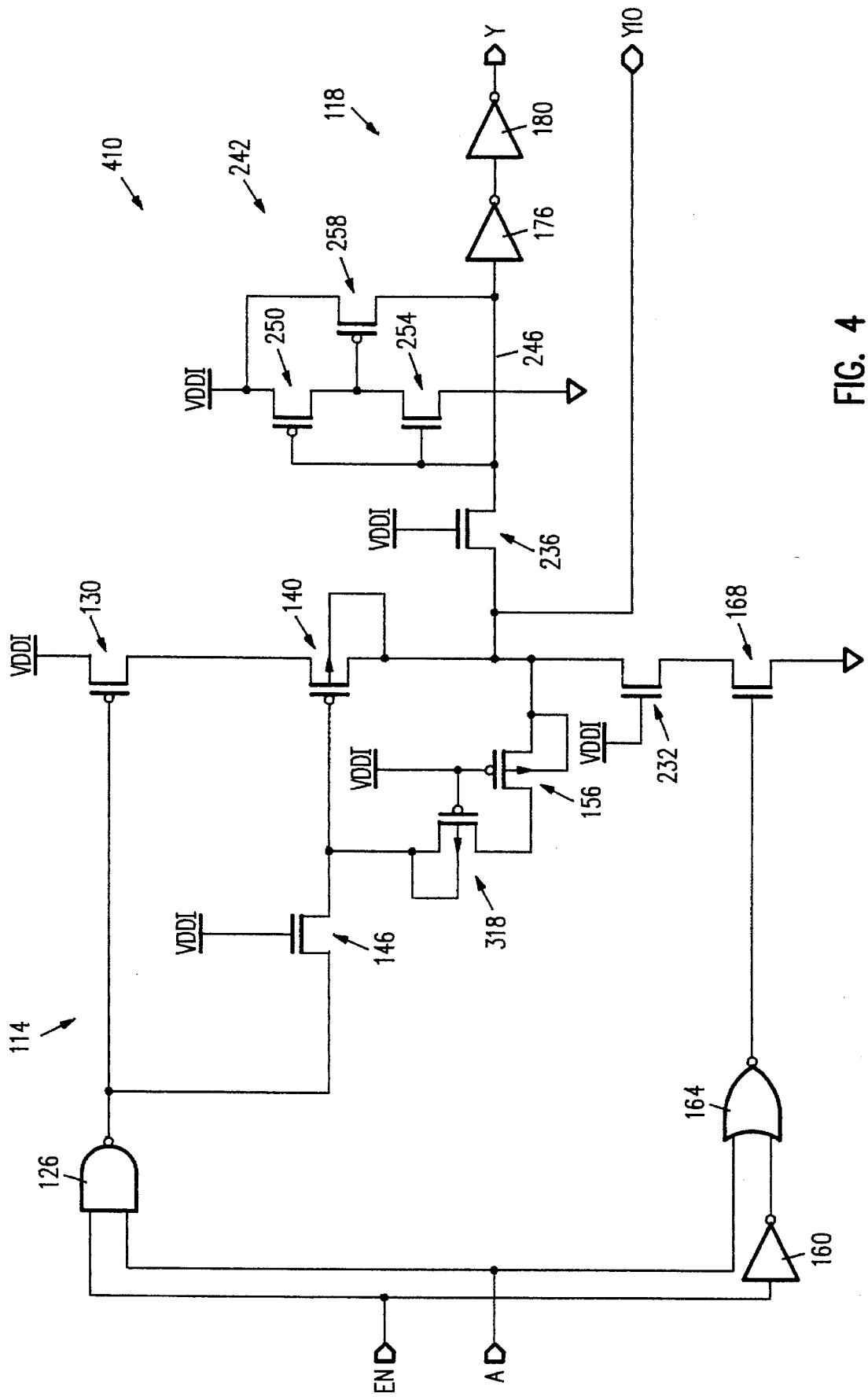

Input/output buffer 410 of FIG. 4 is similar to buffer 310 but buffer 410 includes transistors 232, 236 to prevent the gate-to-source and gate-to-drain voltages from reaching 5.0 V. Transistors 232, 236 are connected as in buffer 210 (FIG. 2). Pull-up circuit 242 of FIG. 4 is similar to that of FIG. 2. Buffer 410 does not include transistor 226 of FIG. 2 because the gate of transistor 146 of buffer 410 is connected to supply voltage VDDI and because, therefore, the gate-to-source and gate-to-drain voltages of transistor 146 are below 5.0 V.

In some CMOS embodiments, the circuit elements of FIGS. 1–4 have the following dimensions:

in FIG. 1, gate 126 has wp=40(that is, each P channel transistor of gate 126 has a channel width of 40 µm) and wn=40 (that is, each N channel transistor has a channel width of 40 µm). All the channel lengths are 1 µm unless otherwise noted below;

transistor 130 has a dimension of 410/1 (that is, the channel width/length dimension is 410 µm/1 µm;

inverter 150 has wn=6, ln=1, wp=18, lp=1;

transistor 146 has a dimension of 40.1;

inverter 160 has wp=11,wn=4;

gate 164 has wp=12, wn=10;

transistor 156 has a dimension of 30/1;

transistor 140 has a dimension of 410/1;

transistor 168 has a dimension of 126/1;

inverter 176 has wp=12, lp=2, wn=72, ln=2;

inverter 180 has wp=30, wn=36;

in FIG. 2, gate 126, inverter 160, and transistors 130 and 140 have the same dimensions as in FIG. 1;

inverter 150 has wn=5, ln=2, wp=15, lp=2;

gate 164 has wp=24, wn=20;

each of transistors 146, 226 has a dimension of 28/1;

transistor 156 has a dimension of 40/1;

each of transistors 232, 168 has a dimension of 260/1;

each of transistors 236, 254 has a dimension of 20/1;

each of transistors 250, 258 has a dimension of 10/1;

inverters 176, 180 have the same dimensions as in FIG. 1;

in FIG. 3, gate 126, inverter 160, gate 164, and transistors 130, 140 have the same dimensions as in FIG. 1;

transistor 146 has a dimension of at least 40/1;

transistors 318, 156 each have a dimension of at least 30/1;

transistor 168 has a dimension of 100/1;

inverters 176, 180 have the same dimensions as in FIG. 1;

in FIG. 4, gates 126 and 164, inverter 160, transistors 130, 140, 146, 232, 168 have the same dimensions as in FIG. 2;

transistor 318 has a dimension of 20/1;

transistor 156 has a dimension of 40/1;

transistors 236, 254, 250, 258 and inverters 176, 180 have the same dimensions as in FIG. 2.

While the invention has been illustrated with respect to the embodiments described above, other embodiments and variations are within the scope of the invention. In particular, the invention is not limited by the transistor sizes or by particular transistor connections. For example, in some embodiments, transistors 140, 130 are interchanged so that the source of transistor 140 is connected to supply voltage VDDI, the drain is connected to the source of transistor 130, and the drain of transistor 130 is connected to input/output terminal YIO. The invention is suitable for output buffers, that is, input buffer 118 is omitted in some embodiments. The invention is not limited by particular voltage values. Thus in some embodiments, voltage VDDI is below ground. In some embodiments, the ground voltage is replaced by another reference voltage. The invention is not limited by a particular fabrication technology. Thus, in some embodiments, the invention is implemented using NWELL CMOS technology in which circuits are formed on a P-doped substrate and the PMOS transistors are formed in one or more NWELLs. In other embodiments, PWELL technology or twin tub technology is used. In some embodiments, the entire input/output buffer is integrated, while in other embodiments discrete components are used. In some embodiments, the bus is integrated with one or more modules. In other embodiments, the bus is not integrated. Other embodiments and variations are within the scope of the invention as defined by the following claims.

What is claimed is:

1. An output driver comprising:

a data input terminal;

an enable terminal;

a power terminal for receiving a power supply voltage;

an output terminal;

a pull-up transistor coupled between the power terminal and the output terminal;

a control circuit for controlling the pull-up transistor, the circuit having a first input terminal coupled to the data input terminal and a second input terminal coupled to the enable terminal, the circuit having an output terminal coupled to a gate of the pull-up transistor;

an isolation transistor coupled between the power terminal and the output terminal in series with the pull-up transistor and having a backgate coupled to the output terminal, the isolation transistor isolating the power terminal from the output terminal when during operation a voltage on the output terminal exceeds in magnitude a voltage on the power terminal by at least a predetermined value;

means interconnecting the output terminal and a gate of the isolation transistor for turning off the isolation transistor when during operation a voltage on the output terminal exceeds in magnitude a voltage on the power terminal by at least the predetermined value; and a control transistor for controllably passing signals produced by the control circuit to the gate of the isolation transistor so that the isolation transistor is turned on when the pull-up transistor is on, the control transistor being off when the voltage on the gate of the isolation transistor exceeds in magnitude the voltage on the power terminal by at least the predetermined value.

2. The driver of claim 1 wherein the control transistor is coupled between the control circuit and the gate of the isolation transistor.

3. The driver of claim 1 further comprising an inverter coupled between the control circuit and the gate of the control transistor.

4. The driver of claim 1 further comprising a voltage-limiter transistor coupled in series with the control transistor between the control transistor and the gate of the isolation transistor for keeping gate-to-source and gate-to-drain voltages in the driver lower in magnitude than a maximum voltage on the output terminal.

5. A method of preventing a charge leakage between an output terminal and a power supply of an output driver, the method comprising the steps of:

when the output driver is enabled and a pull-up transistor is on, connecting a gate of an isolation transistor which is coupled in series with the pull-up transistor, to a gate of the pull-up transistor so as to turn on the isolation transistor and to drive the output terminal through the pull-up and isolation transistors with a voltage provided by the power supply;

when the output driver is disabled or powered down and a voltage on the output terminal exceeds in magnitude the voltage provided by the power supply by at least a predetermined value, disconnecting the gate of the isolation transistor from the gate of the pull-up transistor and connecting the gate of the isolation transistor to the output terminal thereby turning off the isolation transistor; and connecting a backgate of the isolation transistor to the output terminal.

6. An output driver comprising:

a power terminal coupled to a reference voltage source;

an output terminal:

a pull-up circuit coupled between the power terminal and the output terminal including:

a first pull-up circuit transistor having a first control terminal;

a pull-up circuit isolation transistor coupled in series with the first pull-up circuit transistor to form a controlled-conductivity conductive path between the power terminal and the output terminal, having a second control terminal and having a backgate terminal coupled to the output terminal; and a pull-up control circuit coupled to an input terminal to receive an input signal, coupled to an enable terminal to receive an enable signal, and coupled to the output terminal, including:

a pull-up controller coupled to the input terminal and the enable terminal and controlling a first signal on the first control terminal so that:

when the enable signal is deasserted, the first pull-up circuit transistor suppresses the controlled-conductivity conductive path; and when the enable signal is asserted, the first pull-up circuit transistor controls conductivity of the controlled-conductivity conductive path in response to the input signal applied at the first control terminal; and a protection circuit coupled to the output terminal and coupled to the second control terminal so that:

when during operation the reference voltage has a magnitude greater than the output terminal voltage, a conductive path is suppressed between the second control terminal and the output terminal; and when during operation the output terminal voltage has a magnitude greater than the reference voltage by a predetermined voltage level, a conductive path exists between the second control terminal and the output terminal thereby suppressing the controlled-conductivity conductive path at the pull-up circuit isolation transistor; and a control transistor regulating a conductive path between the first control terminal and the second control terminal so that:

when the enable signal is asserted and the first pull-up circuit transistor is conductive in the conductivity-controlled conductive path, the pull-up circuit isolation transistor is also conductive; and when the enable signal is deasserted and the output terminal voltage has a greater magnitude than the reference voltage by at least the predetermined voltage level, the control transistor is suppressed.

7. The output driver of claim 6 wherein when the enable signal is deasserted, the control transistor is cut off for all voltage levels on the output terminal.

8. The output driver of claim 6 wherein the protection circuit is a field effect transistor having a current-carrying terminal and a backgate terminal coupled to the output terminal.

9. The output driver of claim 6 wherein the protection circuit comprises:

a first protection circuit transistor having a current-carrying path, a backgate terminal coupled to the current-carrying path and a control terminal coupled to the power terminal; and a second protection circuit transistor having a current-carrying path, a backgate terminal coupled to the current-carrying path and a control terminal coupled to the power terminal, the second protection circuit current-carrying path being coupled in series with the first protection circuit transistor current-carrying path between the second control terminal and the output terminal.

10. The output driver of claim 6 wherein the control transistor is a first control transistor, the output driver further comprising:

a second control transistor coupled in series with the first control transistor in the conductive path between the first control terminal and the second control terminal and having a control terminal coupled to the power terminal.

11. The output driver of claim 6 wherein the reference voltage is a first reference voltage, further comprising:

a reference terminal coupled to a second reference voltage source the second reference voltage being different from the first reference voltage;

a pull-down circuit coupled between the reference terminal and the output terminal including:

a first pull-down circuit transistor having a third control terminal;

a second pull-down circuit transistor coupled in series with the first pull-down circuit transistor to form a conductive path between the reference terminal and the output terminal, having a fourth control terminal coupled to the power terminal so that when the voltage on the output terminal has a greater magnitude than the first reference voltage the conductive path through the second pull-down transistor is suppressed; and a pull-down control circuit coupled to the input terminal to receive the input signal and coupled to the enable terminal to receive the enable signal and controlling the signal on the third control terminal as a function of the input signal and the enable signal.

12. The output driver of claim 6 wherein the output terminal is coupled to an input terminal to form a combined input/output terminal, further comprising:

an input buffer coupled between the input/output terminal and an input terminal;

an input buffer transistor having a conductive path coupled between the input buffer and the input/output terminal and having a control terminal coupled to the power terminal so that during operation when the voltage levels on the input/output terminal and the input buffer have a greater magnitude than the reference voltage, the conductive path of the input buffer transistor is suppressed.

13. The output driver of claim 12, further comprising:

an input pull-up circuit coupled to the input buffer for pulling the input buffer voltage to the reference voltage when during operation a voltage on the input/output terminal has a magnitude greater than or equal to the reference voltage.

* * * * *